(12) United States Patent
Eom et al.

(10) Patent No.: US 9,105,317 B2
(45) Date of Patent: Aug. 11, 2015

(54) MEMORY SYSTEM CAPABLE OF CALIBRATING OUTPUT VOLTAGE LEVEL OF SEMICONDUCTOR MEMORY DEVICE AND METHOD OF CALIBRATING OUTPUT VOLTAGE LEVEL OF SEMICONDUCTOR MEMORY DEVICE

(75) Inventors: Yoon-Joo Eom, Hwaseong-si (KR); Young-Jin Jeon, Hwaseong-si (KR); Yong-Cheol Bae, Yongin-si (KR); Young-Chul Cho, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 401 days.

(21) Appl. No.: 13/611,867

(22) Filed: Sep. 12, 2012

(65) Prior Publication Data

US 2013/0182513 A1    Jul. 18, 2013

Related U.S. Application Data

(60) Provisional application No. 61/586,253, filed on Jan. 13, 2012.

(30) Foreign Application Priority Data

Apr. 2, 2012    (KR) .................... 10-2012-0033938

(51) Int. Cl.
  *H03K 19/003*    (2006.01)
  *G11C 7/10*    (2006.01)
  *H03K 19/00*    (2006.01)
  *G11C 29/02*    (2006.01)

(52) U.S. Cl.
  CPC ............ *G11C 7/1057* (2013.01); *G11C 29/021* (2013.01); *G11C 29/028* (2013.01); *H03K 19/0005* (2013.01); *G11C 2207/2254* (2013.01)

(58) Field of Classification Search
  CPC .............. H03K 19/017545; G11C 2207/2254; G06F 13/4086
  USPC ......................................... 326/21, 23, 30, 82
  See application file for complete search history.

(56) References Cited

U.S. PATENT DOCUMENTS

| | | | |
|---|---|---|---|
| 7,696,778 B1 | 4/2010 | Sreeramaneni et al. | |
| 7,969,182 B2 | 6/2011 | Kim et al. | |
| 8,384,423 B2* | 2/2013 | Nguyen et al. | 326/30 |
| 2007/0153590 A1* | 7/2007 | Seo et al. | 365/189.09 |
| 2008/0219068 A1 | 9/2008 | Kim et al. | |
| 2010/0060316 A1 | 3/2010 | Kim et al. | |
| 2010/0164540 A1* | 7/2010 | Kwean | 326/30 |
| 2011/0102073 A1 | 5/2011 | Riho | |
| 2011/0194326 A1* | 8/2011 | Nakanishi et al. | 365/51 |
| 2012/0182044 A1* | 7/2012 | Oh | 326/30 |

* cited by examiner

*Primary Examiner* — Don Le
(74) *Attorney, Agent, or Firm* — Harness, Dickey & Pierce, P.L.C.

(57) ABSTRACT

Provided are a semiconductor memory device and a memory system including the same, which may calibrate a level of an output voltage in consideration of channel environment and a mismatch in on-die termination (ODT) resistance of a memory controller. The memory system includes a memory controller and a semiconductor memory device. The semiconductor memory device is configured to generate a reference voltage based on driving information of the memory controller, and calibrate an output voltage level based on a reference voltage when the semiconductor memory device is electrically connected to the memory controller.

17 Claims, 10 Drawing Sheets

MEMORY SYSTEM CAPABLE OF CALIBRATING OUTPUT VOLTAGE LEVEL OF SEMICONDUCTOR MEMORY DEVICE AND METHOD OF CALIBRATING OUTPUT VOLTAGE LEVEL OF SEMICONDUCTOR MEMORY DEVICE

CROSS-REFERENCE TO RELATED APPLICATION

This application claims the benefit of provisional U.S. application Ser. No. 61/586,253 filed Jan. 13, 2012, and also claims priority under 35 U.S.C. §119 to Korean Patent Application No. 10-2012-0033938 filed on Apr. 2, 2012, the entire contents of each of which are incorporated herein by reference in their entirety.

BACKGROUND

1. Field

Embodiments of the inventive concepts relate to a semiconductor memory device and, more particularly, to a circuit for and method of calibrating an output voltage level of a semiconductor memory device.

2. Description of Related Art

Semiconductor memory devices, which may be used to store data, may be classified into volatile semiconductor memory devices and non-volatile semiconductor memory devices. A volatile semiconductor memory device may store data by charging or discharging a capacitor. A volatile semiconductor memory device, such as a random access memory (RAM), may store and read data during application of power, and lose data during interruption of power. A volatile memory device may be used as a main memory device for a computer.

SUMMARY

Embodiments of the inventive concepts provide a semiconductor memory device capable of calibrating a level of an output voltage in consideration of channel environment and a mismatch in on-die termination (ODT) resistance of a memory controller.

Other embodiments of the inventive concepts provide a memory system including the semiconductor memory device.

Other embodiments of the inventive concepts provide a method of calibrating an output voltage of a semiconductor memory device, by which a level of an output voltage is calibrated in consideration of channel environment and an ODT resistance of a memory controller.

In accordance with an aspect of the inventive concepts, a memory system includes a memory controller and a semiconductor memory device.

The semiconductor memory device generates a reference voltage based on driving information of the memory controller, and calibrates an output voltage level based on the reference voltage when the semiconductor memory device is electrically connected to the memory controller.

The memory system may calibrate an ODT resistance of the semiconductor memory device, calibrate an ODT resistance of the memory controller, and calibrate a level of an output voltage of the semiconductor memory device.

The semiconductor memory device may generate the reference voltage based on a current supplied by a pull-up termination circuit of the memory controller.

The semiconductor memory device may include an output circuit, an ODT calibration circuit, and an output voltage level calibration circuit.

The output circuit may output data stored in a memory cell array to output pads. The ODT calibration circuit may calibrate termination resistances connected to the output pads. The output voltage level calibration circuit may calibrate output voltage levels of the output pads.

The output voltage level calibration circuit may control a magnitude of current supplied by a pull-up termination circuit connected to the output pads, and calibrate output voltage levels of the output pads.

The output voltage level calibration circuit may include a first pull-up termination circuit, a first pull-down termination circuit, a second pull-up termination circuit, a second pull-down termination circuit, a comparison circuit, and a pull-up counter.

The first pull-up termination circuit may be connected to a first output pad and turned on in an output voltage level calibration mode. The first pull-down termination circuit may be connected to the first output pad and turned off in the output voltage level calibration mode. The second pull-up termination circuit may be connected to a second output pad and turned off in the output voltage level calibration mode. The second pull-down termination circuit may be connected to the second output pad and turned on in the output voltage level calibration mode. The comparison circuit may compare a voltage of the first output pad with a voltage of the second output pad. The pull-up counter may generate a calibration code based on an output voltage of the comparison circuit.

A magnitude of current supplied by the first pull-up termination circuit may be controlled in response to the calibration code.

The memory controller may include a first pad, a second pad, a third pull-up termination circuit, a third pull-down termination circuit, a fourth pull-up termination circuit, and a fourth pull-down termination circuit.

The third pull-up termination circuit may be connected to the first pad and turned off in an output voltage level calibration mode. The third pull-down termination circuit may be connected to the first pad and turned on in the output voltage level calibration mode. The fourth pull-up termination circuit may be connected to the second pad and turned on in the output voltage level calibration mode. The fourth pull-down termination circuit may be connected to the second pad and turned off in the output voltage level calibration mode.

In the output voltage level calibration mode, the first pull-up termination circuit may be electrically connected to the third pull-down termination circuit through a first channel, and the second pull-down termination circuit may be electrically connected to the fourth pull-up termination circuit through a second channel A voltage of the second output pad may be determined by current supplied by the fourth pull-up termination circuit and a termination resistance of the second pull-down termination circuit.

The semiconductor memory device may be a stack memory device in which a plurality of chips configured to transmit and receive data and control signals through through-silicon vias (TSVs) are stacked.

In accordance with another aspect of the inventive concepts, a method of calibrating an output voltage includes calibrating an ODT resistance of a semiconductor memory device, calibrating an ODT resistance of a memory controller, electrically connecting the semiconductor memory device and the memory controller through a channel, and calibrating a level of an output voltage of the semiconductor memory device.

The calibration of the level of the output voltage of the semiconductor memory device may include turning on a pull-up termination circuit connected to a first output pad of the semiconductor memory device and turning off a pull-down termination circuit connected to the first output pad of the semiconductor memory device, turning off a pull-up termination circuit connected to a second output pad of the semiconductor memory device and turning on a pull-down termination circuit connected to the second output pad of the semiconductor memory device, turning off a pull-up termination of a first pad of the memory controller and turning on a pull-down termination circuit connected to the first pad of the memory controller, turning on a pull-up termination circuit connected to a second pad of the memory controller and turning off a pull-down termination circuit connected to the second pad of the memory controller, generating a first signal based on a voltage of the first output pad of the semiconductor memory device and a voltage of the second output pad of the semiconductor memory device, and controlling a magnitude of current supplied by the pull-up termination circuit connected to the first output pad based on the first signal.

The calibration of the level of the output voltage of the semiconductor memory device may include electrically connecting the first output pad of the semiconductor memory device and the first pad of the memory controller through a first channel, and electrically connecting the second output pad of the semiconductor memory device and the second pad of the memory controller through a second channel.

In accordance with another aspect of the inventive concepts, a semiconductor memory device includes a memory cell array, an output circuit, an ODT calibration circuit, and an output voltage level calibration circuit.

The output circuit outputs data stored in the memory cell array to output pads. The ODT calibration circuit calibrates termination resistances connected to the output pads. The output voltage level calibration circuit generates a reference voltage based on driving information of a memory controller, and calibrates an output voltage level based on the reference voltage with the output voltage level calibration circuit electrically connected to the memory controller.

In accordance with another example embodiment, a memory system includes a memory controller configured to produce a reference voltage and a semiconductor memory device. The semiconductor memory device including an output circuit configured to output a variable voltage to the memory controller via output pads; a calibration circuit configured to calibrate termination resistances connected to the output pads; and an output voltage level calibration circuit configured to calibrate a level of the variable voltage based on the reference voltage.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF THE EMBODIMENTS

Figure 1:
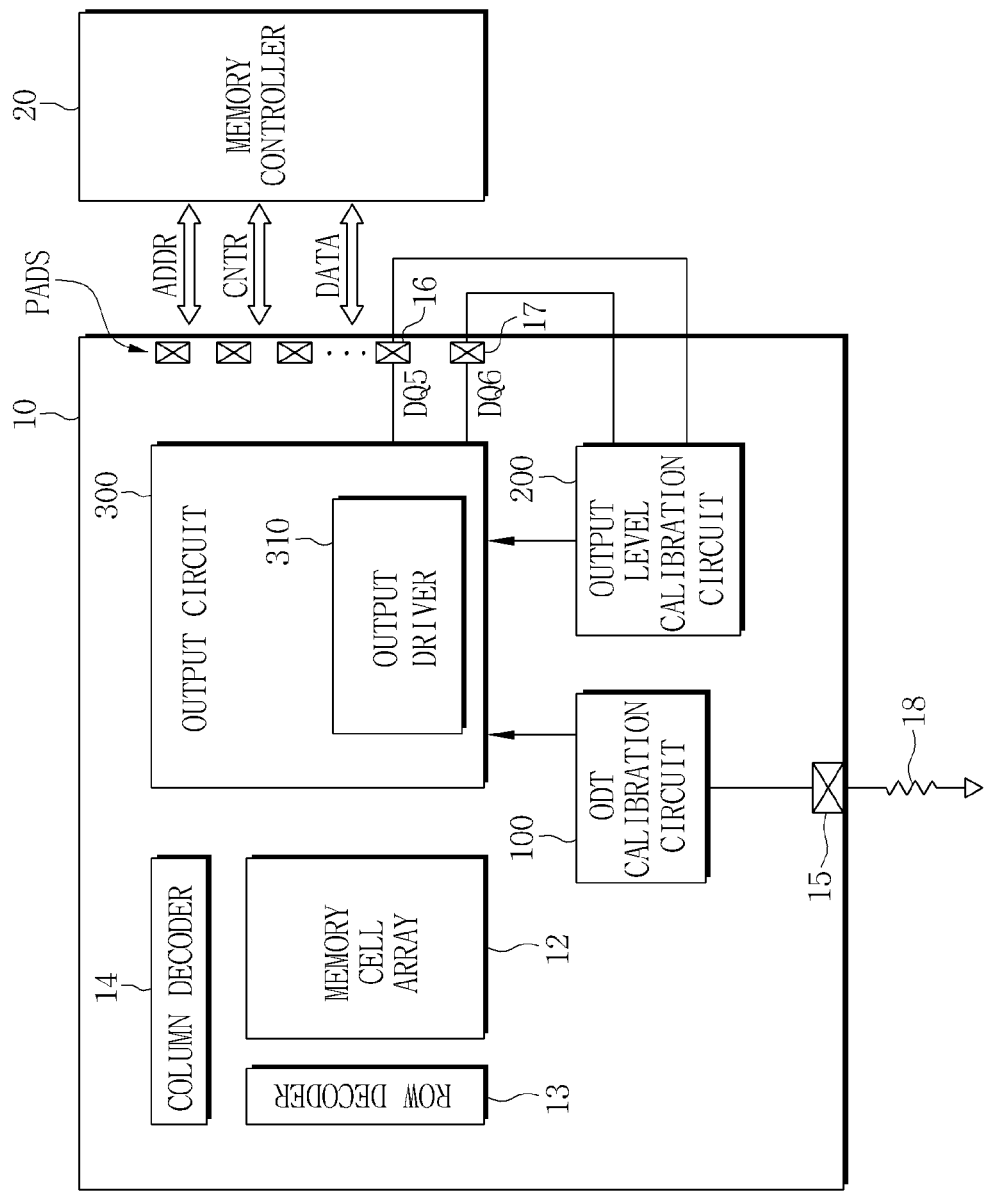
FIG. 1 is a block diagram of an example of a memory system including a semiconductor memory device according to an embodiment of the inventive concepts.

Since example embodiments of the inventive concepts are provided only for structural and functional descriptions of the inventive concepts, the inventive concepts should not be construed as limited to the embodiments set forth herein. Thus, it will be clearly understood by those skilled in the art that the example embodiments of the inventive concepts may be embodied in different forms and include equivalents that can realize the spirit of the inventive concepts. It should be understood, however, that it is not intended to limit the inventive concepts to the particular forms disclosed, but on the contrary, the inventive concepts are to cover all modifications, equivalents, and alternatives falling within the spirit and scope of the inventive concepts as defined by the appended claims.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concepts.

It will be understood that when an element or layer is referred to as being "connected to" or "coupled to" another element or layer, it can be directly connected or coupled to the other element or layer or intervening elements or layers may be present. In contrast, when an element is referred to as being "directly connected to" or "directly coupled to" another element or layer, there are no intervening elements or layers present. Meanwhile, spatially relative terms, such as "between" and "directly between" or "adjacent to" and "directly adjacent to" and the like, which are used herein for ease of description to describe one element or feature's relationship to another element(s) or feature(s) as illustrated in the figures, should be interpreted similarly.

The terminology used herein is for the purpose of describing particular embodiments only and is not intended to be limiting of the inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the inventive concepts belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Unless expressly defined in a specific order herein, respective steps described in the inventive concepts may be performed otherwise. That is, the respective steps may be performed in a specified order, substantially at the same time, or in reverse order.

The inventive concepts will now be described more fully hereinafter with reference to the accompanying drawings, in which example embodiments of the inventive concepts are shown.

FIG. 1 is a block diagram of an example of a memory system including a semiconductor memory device according to an embodiment of the inventive concepts.

Referring to FIG. 1, the memory system may include a semiconductor memory device 10 and a memory controller 20.

The memory controller 20 may generate an address signal ADDR and a control signal CNTR and provide the address signal ADDR and the control signal CNTR through buses. Data DATA may be transmitted from the memory controller 20 to the semiconductor memory device 10 through the buses, or transmitted from the semiconductor memory device 10 to the memory controller 20 through the buses.

The semiconductor memory device 10 may include a memory cell array 12, a row decoder 13, a column decoder 14, an on-die-termination (ODT) calibration circuit 100, and output voltage level calibration circuit 200, and an output circuit 300. The output circuit 300 may include an output driver 310. The semiconductor memory device 10 may include an external apparatus and pads PADS configured to receive signals and data.

The semiconductor memory device 10 may generate a reference voltage based on driving information of the memory controller 20, and calibrate an output voltage level based on the reference voltage when the semiconductor memory device 10 is electrically connected to the memory controller 20.

The output voltage level calibration circuit 200 may be connected to pads 16 and 17 and communicate with the memory controller 20 through the pads 16 and 17. The pad 16 may be connected to an output pin DQ5, and the pad 17 may be connected to an output pin DQ5. The semiconductor memory device 10 may include a pad 15 configured to connect the ODT calibration circuit 100 with an external resistor 18 disposed outside the semiconductor memory device 10.

The memory system of FIG. 1 may calibrate an ODT resistance of the semiconductor memory device 10, calibrate the ODT resistance of the memory controller 20, and calibrate a level of an output voltage of the semiconductor memory device 10.

Figure 2:
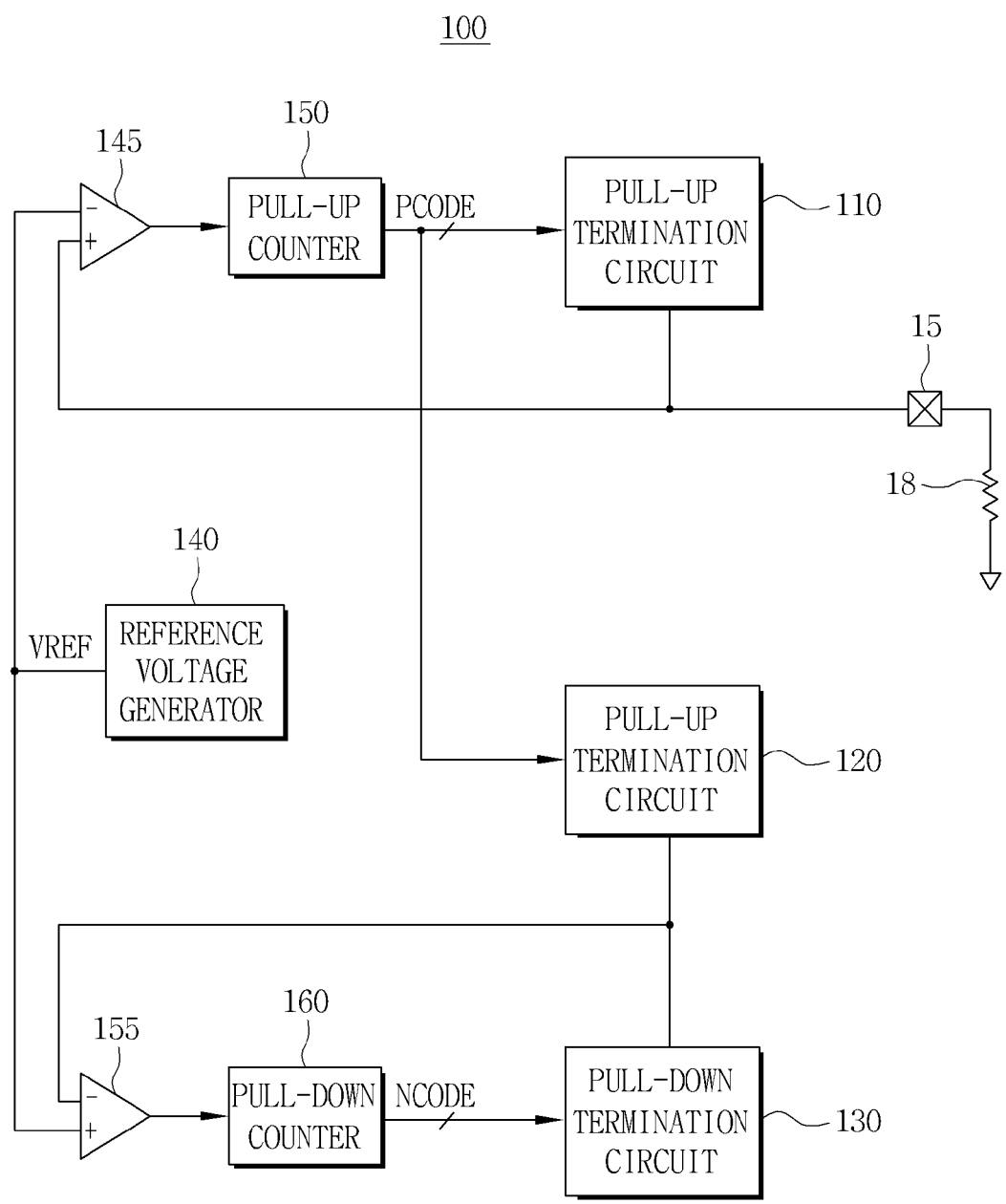
FIG. 2 is a circuit diagram of an example of an on-die-termination (ODT) calibration circuit included in the semiconductor memory device of FIG. 1.

FIG. 2 is a circuit diagram of an example of an on-die-termination (ODT) calibration circuit 100 included in the semiconductor memory device of FIG. 1.

Referring to FIG. 2, the ODT calibration circuit 100 may include a pad 15, a pull-up termination circuit 110, a pull-up termination circuit 120, a pull-down termination circuit 130, a reference voltage generation circuit 140, a first comparison circuit 145, a second comparison circuit 155, a pull-up counter 150, and a pull-down counter 160. The external resistor 18 disposed outside the semiconductor memory device 10 may be connected to the pad 15. The pull-up termination circuit 110 may include PMOS transistors, NMOS transistors, or a resistor and turn on in response to a pull-up calibration code PCODE. The pull-down termination circuit 130 may include PMOS transistors, NMOS transistors, or a resistor and turn on in response to a pull-down calibration code NCODE. The pull-up termination circuit 120 may have the same circuit configuration as the pull-up termination circuit 110 but be connected to the pull-down termination circuit 130. The pull-up termination circuit 110 may be connected to the external resistor 18.

The reference voltage generation circuit 140 may generate a reference voltage VREF. The first comparison circuit 145 may compare the reference voltage VREF with a voltage of the pad 15, and the second comparison circuit 155 may compare the reference voltage VREF with a voltage of a connection node between the pull-down termination circuit 130 and the pull-up termination circuit 120. The pull-up counter 150 may generate a pull-up calibration code PCODE based on an output signal of the first comparison circuit 145, and the pull-down counter 160 may generate a pull-down calibration code NCODE based on an output signal of the second comparison circuit 155.

The ODT calibration circuit 100 may repeat a comparison operation using the first comparison circuit 145 and the second comparison circuit 155, and control resistances of the pull-up termination circuit 110, the pull-down termination circuit 130, and the pull-up termination circuit 120. Due to this calibration operation, the resistance of the pull-up termination circuit 110 may become equal to the resistance of the external resistor 18. For instance, the external resistor 18 may have a resistance of about 240 ohms.

Figure 3:
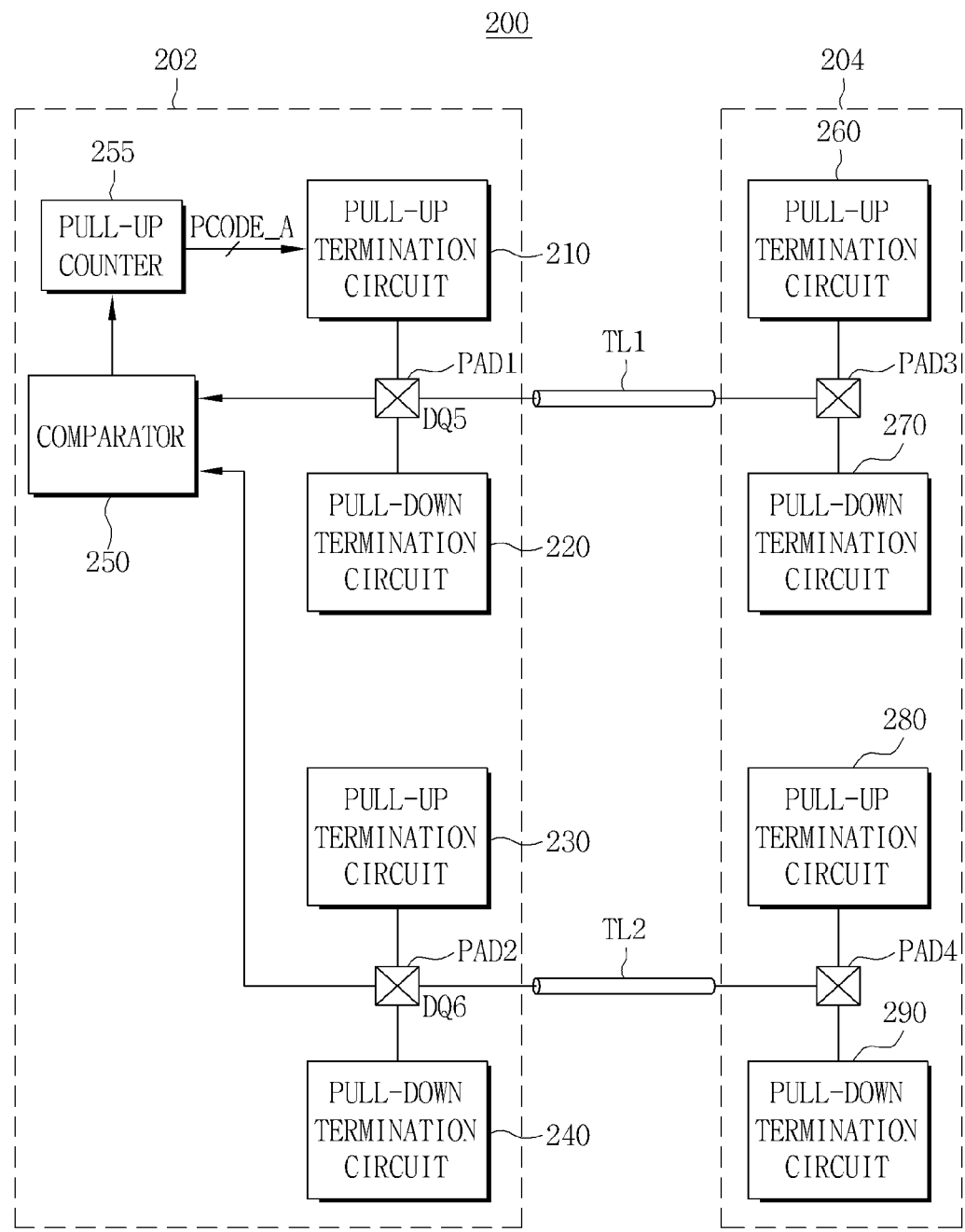
FIG. 3 is a block diagram of an example of an output voltage level calibration circuit included in the semiconductor memory device of FIG. 1.

FIG. 3 is a block diagram of an example of the output voltage level calibration circuit 200 included in the semiconductor memory device of FIG. 1.

Referring to FIG. 3, the output voltage level calibration circuit 200 may include a first output voltage level calibrator 202, a second output voltage level calibrator 204, and channels TL1 and TL2. The first output voltage level calibrator 202 may be a circuit included in the semiconductor memory device 10, while the second output voltage level calibrator 204 may be a circuit included in the memory controller 20.

According to an embodiment of the inventive concepts, the first output voltage level calibrator 204 may include a first pull-up termination circuit 210, a first pull-down termination circuit 220, a second pull-up termination circuit 230, a second pull-down termination circuit 240, a comparison circuit 250, and a pull-up counter 255.

The first pull-up termination circuit 210 may be connected to a first output pad PAD1 and turned on in an output voltage level calibration mode. The first pull-down termination circuit 220 may be connected to a first output pad PAD1 and turned off in the output voltage level calibration mode. The second pull-up termination circuit 230 may be connected to a second output pad PAD2 and turned off in the output voltage level calibration mode. The second pull-down termination circuit 240 may be connected to the second output pad PAD2 and turned on in the output voltage level calibration mode. The comparison circuit 250 may compare a voltage of the first output pad PAD1 with a voltage of the second output pad PAD2. The pull-up counter 255 may generate a calibration code PCODE_A based on an output voltage of the comparison circuit 250.

The second output voltage level calibrator 204 may include a first pad PAD3, a second pad PAD4, a third pull-up termination circuit 260, a third pull-down termination circuit 270, a fourth pull-up termination circuit 280, and a fourth pull-down termination circuit 290.

The third pull-up termination circuit 260 may be connected to a first pad PAD3 and turned off in an output voltage level calibration mode. The third pull-down termination circuit 270 may be connected to the first pad PAD3 and turned on in the output voltage level calibration mode. The fourth pull-up termination circuit 280 may be connected to the second pad PAD4 and turned on in the output voltage level calibration mode. The fourth pull-down termination circuit 290 may be connected to the second pad PAD4 and turned off in the output voltage level calibration mode.

In the output voltage level calibration mode, the first pull-up termination circuit 210 may be electrically connected to the third pull-down termination circuit 270 through a first channel TL1, while the second pull-down termination circuit 240 may be electrically connected to the fourth pull-up termination circuit 280 through a second channel TL2.

The output voltage level calibration circuit 200 may control a magnitude of current supplied by the first pull-up termination circuit 210 connected to the first output pad PAD1 and calibrate an output voltage level of the output pad PAD1.

Figure 4:
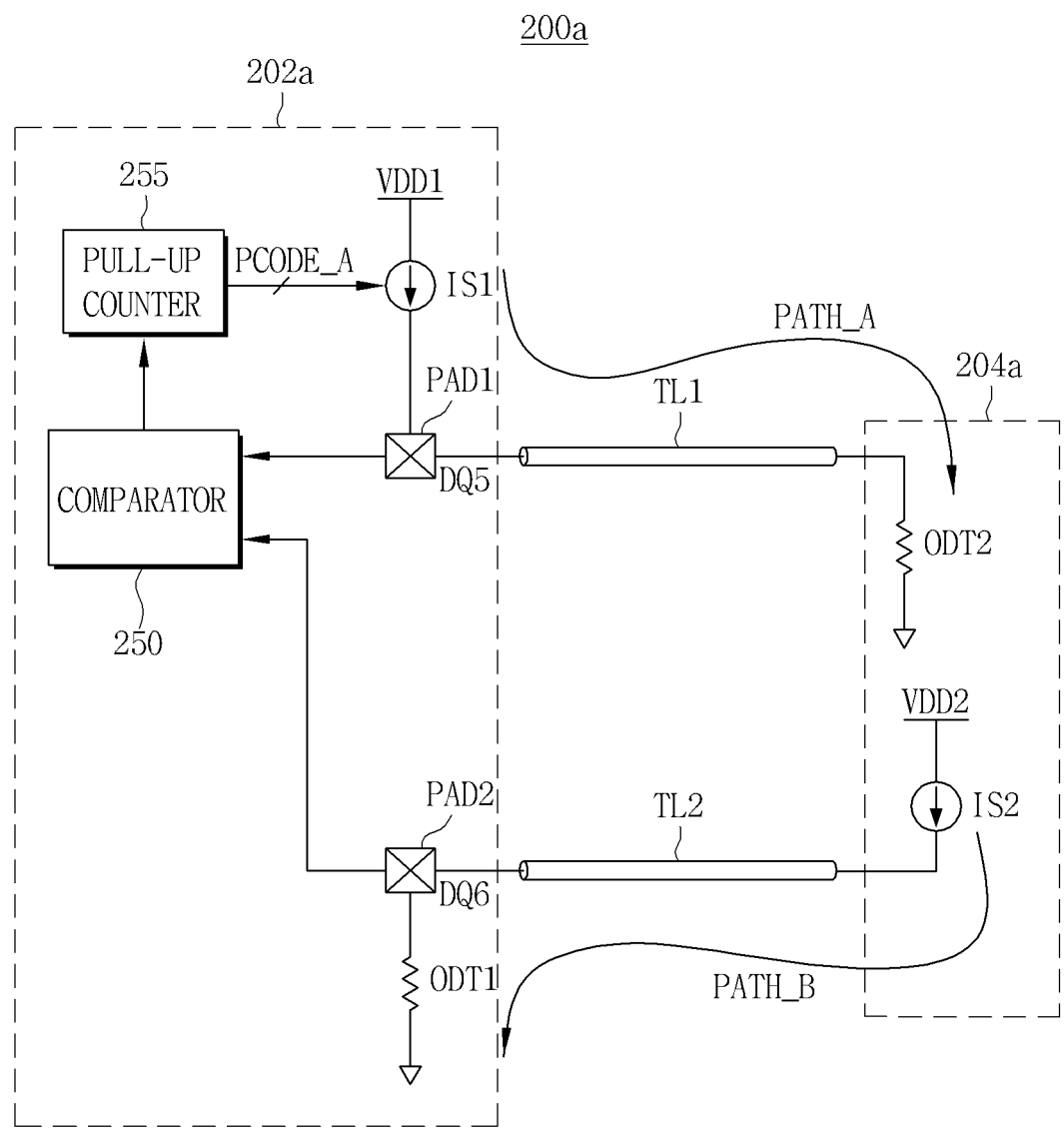
FIG. 4 is a simplified diagram illustrating an operation of the output voltage level calibration circuit of FIG. 3 in an output voltage level calibration mode.

FIG. 4 is a simplified diagram illustrating an operation of the output voltage level calibration circuit of FIG. 3 in an output voltage level calibration mode.

Referring to FIGS. 3 and 4, in the output voltage level calibration mode, the first pull-up termination circuit 210 may be denoted by a first current source IS1, the second pull-down termination circuit 240 may be denoted by a first ODTresistorODT1, a third pull-down termination circuit 270 may be denoted by a second ODTresistorODT2, and the fourth pull-up termination circuit 280 may be denoted by a second current source IS2.

In the output voltage level calibration mode, the fourth pull-up termination circuit 280, the second channel TL2 and the second pull-down termination circuit 240 may form a single current path PATH_B. Also, in the output voltage level calibration mode, the first pull-up termination circuit 210, the first channel TL1, and the third pull-down termination circuit 270 may form a single current path PATH_A.

A voltage determined by the second current source IS2 included in the memory controller 20 and the first ODT resistor ODT1 of the semiconductor memory device 10, that is, a voltage of the second output pad PAD2, may become a reference voltage of a comparator 250. The comparator 250 may compare a voltage of the first output pad PAD1 with the voltage of the second output pad PAD2. The pull-up counter 255 may generate a calibration code PCODE_A based on an output voltage of the comparator 250. A magnitude of current supplied by the first pull-up termination circuit 210, that is, a magnitude of the first current source IS1, may be controlled in response to the calibration code PCODE_A.

Accordingly, the semiconductor memory device according to the embodiments of the inventive concepts may calibrate a level of an output voltage in consideration of channel environment and an ODT resistance of the memory controller 20.

Figure 5:
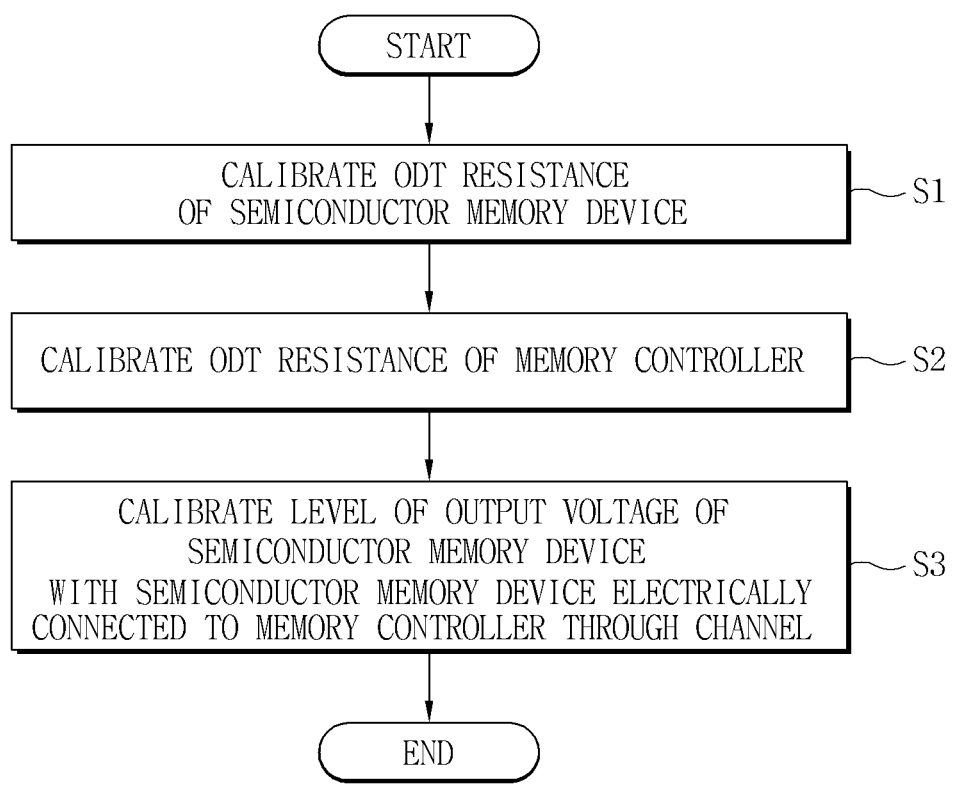
FIG. 5 is a flowchart illustrating a method of calibrating an output voltage level of a semiconductor memory device according to an embodiment of the inventive concepts.

FIG. 5 is a flowchart illustrating a method of calibrating an output voltage level of a semiconductor memory device according to an embodiment of the inventive concepts.

Referring to FIG. 5, the method of calibrating the output voltage level may include the following operations.

1) An ODT resistance of the semiconductor memory device may be calibrated (operation S1).

2) An ODT resistance of a memory controller may be calibrated (operation S2).

3) The semiconductor memory device may be electrically connected to the memory controller through a channel and a level of an output voltage of the semiconductor memory device may be calibrated (operation S3).

Figure 6:
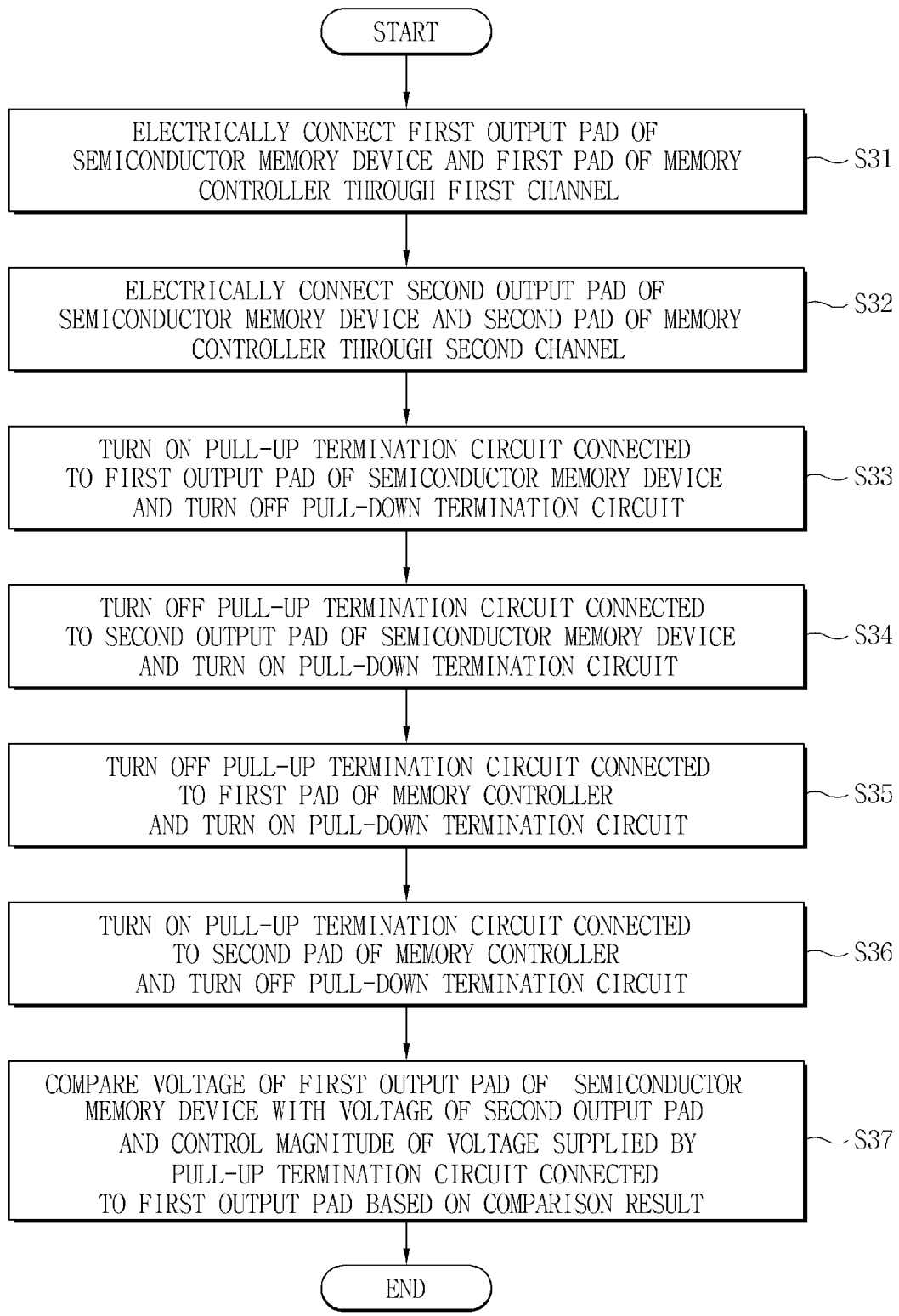
FIG. 6 is a detailed flowchart illustrating a method of calibrating an output voltage level of the semiconductor memory device shown in FIG. 5.

FIG. 6 is a detailed flowchart illustrating a method of calibrating an output voltage level of the semiconductor memory device shown in FIG. 5.

Referring to FIG. 6, the method of calibrating the output voltage level of the semiconductor memory device may include the following operations.

1) A first output pad of the semiconductor memory device may be electrically connected to a first pad of the memory controller through a first channel (operation S31).

2) A second output pad of the semiconductor memory device may be electrically connected to a second pad of the memory controller through a second channel (operation S32).

3) A pull-up termination circuit 210 connected to the first output pad of the semiconductor memory device may be turned on, while a pull-down termination circuit 220 connected to the first output pad of the semiconductor memory device may be turned off (operation S33).

4) A pull-up termination circuit 230 connected to the second output pad of the semiconductor memory device may be turned off, while a pull-down termination circuit 240 connected to the second output pad of the semiconductor memory device may be turned on (operation S34).

5) A pull-up termination circuit 260 connected to the first pad of the memory controller may be turned off, while a pull-down termination circuit 270 connected to the first pad of the memory controller may be turned on (operation S35).

6) A pull-up termination circuit 280 connected to the second pad of the memory controller may be turned on, while a pull-down termination circuit 290 connected to the second pad of the memory controller may be turned off (operation S36).

7) A voltage of the first output pad PAD1 of the semiconductor memory device may be compared with a voltage of the second output pad PAD2 of the semiconductor memory device to generate a first signal, and a magnitude of current supplied by the pull-up termination circuit 210 connected to the first output pad may be controlled based on the first signal (operation S37).

Figure 7:
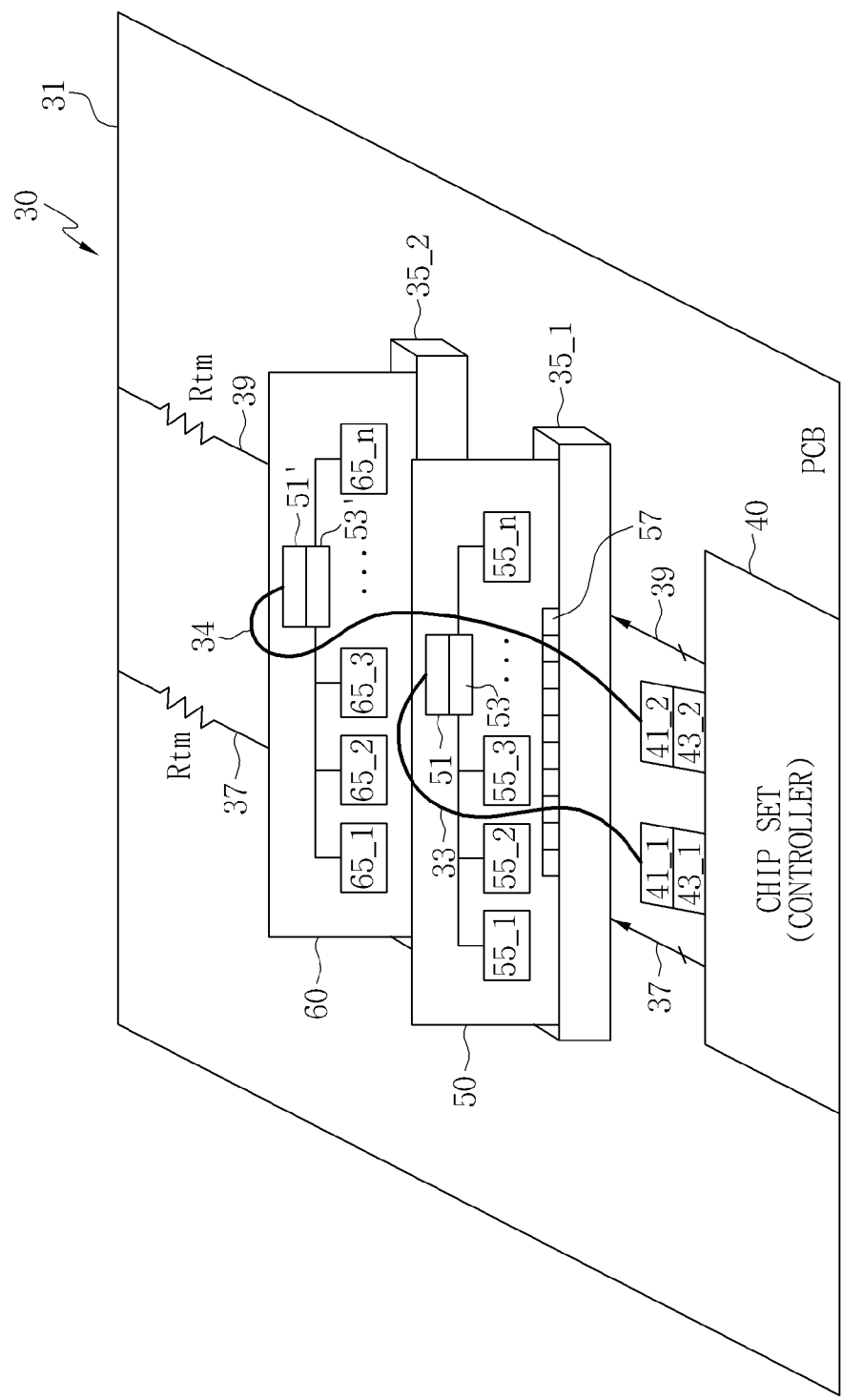
FIG. 7 is a diagram of an example of a memory system including a semiconductor memory device according to embodiments of the inventive concepts.

FIG. 7 is a diagram of an example of a memory system 30 including a semiconductor memory device according to embodiments of the inventive concepts.

Referring to FIG. 7, the memory system 30 may include a mother board 31, a chipset (or controller) 40, slots 35_1 and 35_2, memory modules 50 and 60, and transmission wires 33 and 34. Buses 37 and 39 may connect the chipset 40 to the slots 35_1 and 35_2. A terminal resistor Rtm may terminate each of the buses 37 and 39 disposed on a printed circuit board (PCB) of the mother board 31.

Although FIG. 7 illustrates two slots 35_1 and 35_2 and two memory modules 50 and 60 for brevity, the memory system 30 may include an arbitrary number of slots and an arbitrary number of memory modules.

The chipset 40 may be mounted on the PCB of the mother board 31 and control an operation of the memory system 30. The chipset 40 may include connectors 41_1 and 41_2 and converters 43_1 and 43_2.

The converter 43_1 may receive parallel data generated by the chipset 40, convert the parallel data into serial data, and output the serial data to the transmission wire 33 through the connector 41-1. The converter 43_1 may receive serial data through the transmission wire 33, convert the serial data into parallel data, and output the parallel data to the chipset 40.

The converter 43_2 may receive the parallel data generated by the chipset 40, convert the parallel data into serial data, and output the serial data to the transmission wire 34 through the connector 41-2. The converter 43_2 may receive serial data through the transmission wire 34, convert the serial data into parallel data, and output the parallel data to the chipset 40. The transmission wires 33 and 34 included in the memory system 30 may be a plurality of optical fibers.

The memory module 50 may include a plurality of memory devices 55_1 to 55_n, a first connector 57, a second connector 51, and converters 53. The memory module 60 may include a plurality of memory devices 65_1 to 65_n, a first connector 57', a second connector 51', and converters 53'.

The first connector 57 may transmit a low-speed signal from the chipset 40 to memory devices, while the second connector 51 may be connected to the transmission wire 33 configured to transmit a high-speed signal.

The converter 53 may receive serial data through the second connector 51, convert the serial data into parallel data, output the parallel data to the plurality of memory devices 55_1 to 55_n. Also, the converter 53 may receive serial data from the plurality of memory devices 55_1 to 55_n, convert the serial data into parallel data, and output the parallel data to the second connector 51.

The plurality of memory devices 55_1 to 55_n and 65_1 to 65_n shown in FIG. 7 may be semiconductor memory devices according to embodiments of the inventive concepts. Accordingly, each of the plurality of memory devices 55_1 to 55_9 may generate a reference voltage based on driving information of a memory controller, and calibrate an output voltage level based on the reference voltage with each of the plurality of memory devices 55_1 to 55_9 electrically connected to the memory controller.

Figure 8:
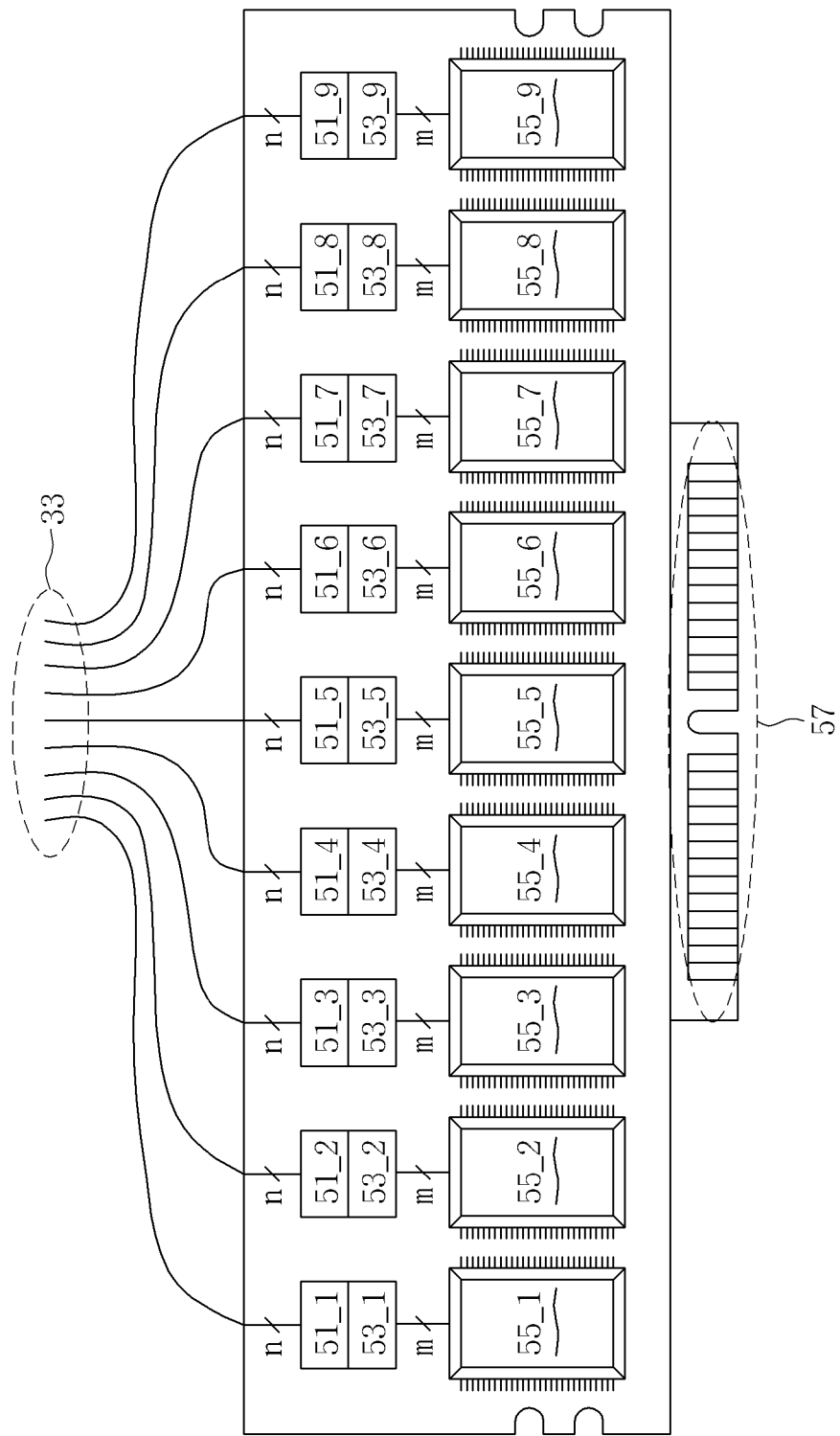
FIG. 8 is a diagram of a memory module constituting the memory system of FIG. 7.

FIG. 8 is a diagram of a memory module constituting the memory system of FIG. 7.

Referring to FIG. 8, the memory module may include a first connector 57, a plurality of memory devices 55_1 to 55_9, a plurality of converters 53_1 to 53_9, and a plurality of second connectors 51_1 to 51_9. As shown in FIG. 8, transmission wires 33 may be a plurality of optical fibers.

The plurality of memory devices 55_1 to 55_9 shown in FIG. 8 may be semiconductor memory devices according to embodiments of the inventive concepts. Accordingly, each of the plurality of memory devices 55_1 to 55_9 may generate a reference voltage based on driving information of a memory controller, and calibrate an output voltage level based on the reference voltage with each of the plurality of memory devices 55_1 to 55_9 electrically connected to the memory controller.

Figure 9:
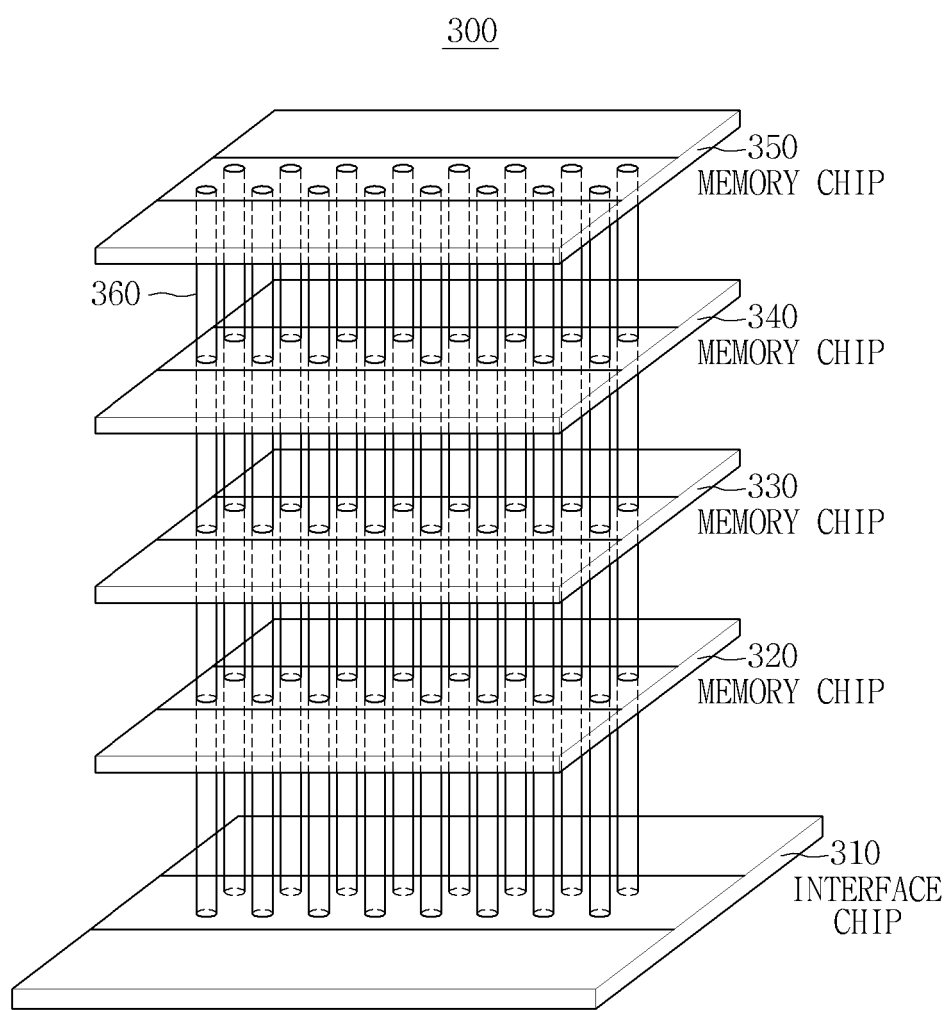
FIG. 9 is a simplified perspective view of an example of a stack memory device including a semiconductor memory device according to embodiments of the inventive concepts.

FIG. 9 is a simplified perspective view of a stack semiconductor device 300 including a semiconductor memory device according to embodiments of the inventive concepts.

Referring to FIG. 9, the stack semiconductor device 300 may include an interface 310 and memory chips 320, 330, 340, and 350 electrically connected by through-silicon vias (TSVs) 360. Although FIG. 9 illustrates the TSVs 360 disposed in two rows, the stack semiconductor device 300 may include an arbitrary number of TSVs.

Each of the memory chips 320, 330, 340, and 350 included in the stack semiconductor device 300 may generate a reference voltage based on driving information of a memory controller, and calibrate an output voltage level based on the reference voltage with each of the memory chips 320, 330, 340, and 350 electrically connected to the memory controller. The interface chip 310 may serve as an interface between the memory chips 320, 330, 340, and 350 and an external apparatus.

Figure 10:
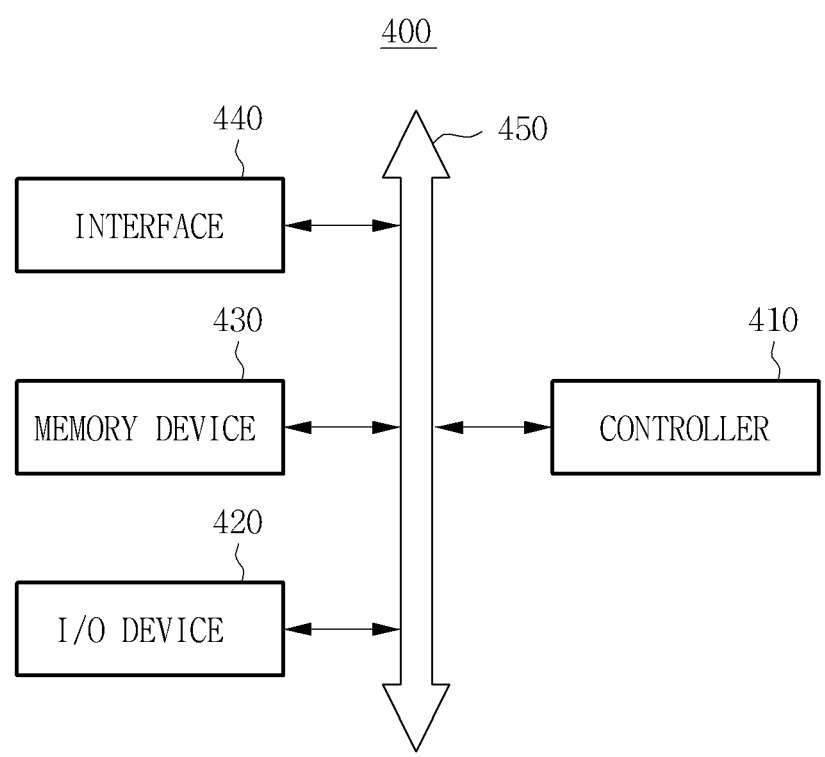
FIG. 10 is a block diagram of an example of an electronic system including a semiconductor memory device according to embodiments of the inventive concepts.

FIG. 10 is a block diagram of an example of an electronic system 400 including a semiconductor memory device according to embodiments of the inventive concepts.

Referring to FIG. 10, the electronic system 400 according to the embodiments of the inventive concepts may include a controller 410, an I/O device 420, a memory device 430, an interface 440, and a bus 450. The memory device 430 may include a semiconductor memory device according to embodiments of the inventive concepts. The semiconductor memory device included in the memory device 430 may generate a reference voltage based on driving information of a memory controller, and calibrate an output voltage level based on the reference voltage with the semiconductor memory device electrically connected to the memory controller. The bus 450 may provide a path through which data may be transmitted among the controller 410, the I/O device 420, the memory device 430, and the interface 440.

The controller 410 may include at least one of at least one microprocessor (MP), at least one digital signal processor (DSP), at least one microcontroller (MC), and logic devices capable of similar functions thereto. The I/O device 420 may include at least one of a keypad, a keyboard, and a display device. The memory device 430 may serve to store data and/or commands executed by the controller 410.

The memory device 430 may include a volatile memory chip, such as a dynamic random access memory (DRAM) or a static RAM (SRAM), a non-volatile memory chip, such as a flash memory, a phase-change memory, a magnetic RAM (MRAM), or a resistive RAM (RRAM), or a combination thereof. The memory device 430 may be a semiconductor memory device including a latency control circuit according to embodiments of the inventive concepts.

The interface 440 may serve to transmit data to a communication network or receive data from the communication network. The interface 440 may include an antenna or a wired/wireless transceiver and transmit/receive data by wire or wirelessly. Also, the interface 440 may include an optical fiber and transmit/receive data through the optical fiber. An application chipset, a camera image processor (CIP), and an I/O device may be further provided in the electronic system 400.

The electronic system 400 may be embodied by a mobile system, a personal computer (PC), an industrial computer, or a logic system with various functions. For example, the mobile system may be any one of a personal digital assistant (PDA), a portable computer (PC), a web tablet, a mobile phone, a wireless phone, a laptop computer, a memory card, a digital music system, and a data transmission/receiving system. When the electronic system 400 is an apparatus capable of wireless communication, the electronic system 400 may be used for a communication system, such as a code division multiple access (CDMA), a global system for mobile communication (GSM), a North American digital cellular (NADC), an enhanced-time division multiple access (E-TDMA), a wideband code division multiple access (WCDMA), or CDMA2000.

The inventive concepts may be applied to a semiconductor device, particularly, a semiconductor memory device.

A semiconductor memory device and a memory system including the same according to embodiments of the inventive concepts can calibrate a level of an output voltage in consideration of channel environment and a mismatch in an ODT resistance of a memory controller. Accordingly, the semiconductor memory device can improve signal integrity and consume small power.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of the inventive concepts as defined in the claims. In the claims, means-plus-function clauses are intended to cover the structures described herein as performing the recited function, and not only structural equivalents but also equivalent structures.

What is claimed is:

1. A memory system comprising:
    a memory controller; and
    a semiconductor memory device including,
        an output circuit configured to output data stored in a memory cell array to the memory controller via output pads;
        an on-die-termination (ODT) calibration circuit configured to calibrate termination resistances connected to the output pads; and
        an output voltage level calibration circuit configured to,
            generate a reference voltage based on driving information of the memory controller, and
            calibrate output voltage levels of the output pads based on the reference voltage when the semiconductor memory device is electrically connected to the memory controller.

2. The system of claim 1, wherein the semiconductor memory device is configured to generate the reference voltage based on a current supplied by a pull-up termination circuit of the memory controller.

3. The system of claim 1, wherein the output voltage level calibration circuit is configured to control a magnitude of current supplied by a pull-up termination circuit connected to the output pads, and the output voltage level calibration circuit is configured to calibrate output voltage levels of the output pads.

4. The system of claim 1, wherein the output voltage level calibration circuit comprises:
    a first pull-up termination circuit connected to a first output pad and configured to be turned on in an output voltage level calibration mode;
    a first pull-down termination circuit connected to the first output pad and configured to be turned off in the output voltage level calibration mode;
    a second pull-up termination circuit connected to a second output pad and configured to be turned off in the output voltage level calibration mode;
    a second pull-down termination circuit connected to the second output pad and configured to be turned on in the output voltage level calibration mode;
    a comparison circuit configured to compare a voltage of the first output pad with a voltage of the second output pad; and
    a pull-up counter configured to generate a calibration code based on an output voltage of the comparison circuit.

5. The system of claim 4, wherein a magnitude of current supplied by the first pull-up termination circuit is controlled in response to the calibration code.

6. The system of claim 4, wherein the memory controller comprises:
    a first pad;
    a second pad;
    a third pull-up termination circuit connected to the first pad and configured to be turned off in an output voltage level calibration mode;
    a third pull-down termination circuit connected to the first pad and configured to be turned on in the output voltage level calibration mode;
    a fourth pull-up termination circuit connected to the second pad and configured to be turned on in the output voltage level calibration mode; and
    a fourth pull-down termination circuit connected to the second pad and configured to be turned off in the output voltage level calibration mode.

7. The system of claim 6, wherein, in the output voltage level calibration mode, the first pull-up termination circuit is electrically connected to the third pull-down termination circuit through a first channel, and in the output voltage level calibration mode the second pull-down termination circuit is electrically connected to the fourth pull-up termination circuit through a second channel.

8. The system of claim 7, wherein a voltage of the second output pad is determined by current supplied by the fourth pull-up termination circuit and a termination resistance of the second pull-down termination circuit.

9. The system of claim 1, wherein the semiconductor memory device is a stack memory device in which a plurality of chips configured to transmit and receive the data and control signals through through-silicon vias (TSVs) are stacked.

10. A method of calibrating an output voltage supplied to a memory controller by a semiconductor memory device, the semiconductor memory device including an output circuit configured to output data stored in a memory cell array to the memory controller via output pads, an on-die-termination (ODT) calibration circuit, and an output voltage level calibration circuit, the method comprising:
    calibrating, by the ODT calibration circuit, an ODT resistance of the semiconductor memory device;
    calibrating, by the OTD calibration circuit, an ODT resistance of memory controller;
    electrically connecting the semiconductor memory device and the memory controller through a channel; and
    calibrating, by the output voltage level calibration circuit, a level of an output voltage of the semiconductor memory device by,
        generating a reference voltage based on driving information of the memory controller, and
        calibrating the level of the output voltage supplied to the output pads based on the reference voltage when the semiconductor memory device is electrically connected to the memory controller.

11. The method of claim 10, wherein the calibrating a level of the output voltage of the semiconductor memory device comprises:
    turning on a pull-up termination circuit connected to a first output pad of the output pad, and turning off a pull-down termination circuit connected to the first output pad of the semiconductor memory device;
    turning off a pull-up termination circuit connected to a second output pad of the output pads, and turning on a pull-down termination circuit connected to the second output pad of the semiconductor memory device;

turning off a pull-up termination of a first pad of the memory controller, and turning on a pull-down termination circuit connected to the first pad of the memory controller;

turning on a pull-up termination circuit connected to a second pad of the memory controller, and turning off a pull-down termination circuit connected to the second pad of the memory controller;

generating a first signal based on a voltage of the first output pad of the semiconductor memory device and a voltage of the second output pad of the semiconductor memory device, the voltage of the second output pad being the reference voltage; and controlling a magnitude of current supplied by the pull-up termination circuit connected to the first output pad based on the first signal.

12. The method of claim 11, wherein the calibrating of the level of the output voltage of the semiconductor memory device further comprises:

electrically connecting the first output pad of the semiconductor memory device and the first pad of the memory controller through a first channel; and electrically connecting the second output pad of the semiconductor memory device and the second pad of the memory controller through a second channel.

13. A semiconductor memory device comprising:

a memory cell array;

an output circuit configured to output data stored in the memory cell array to output pads;

an on-die termination (ODT) calibration circuit configured to calibrate termination resistances connected to the output pads; and an output voltage level calibration circuit configured to,
generate a reference voltage based on driving information of a memory controller, and
calibrate an output voltage level based on the reference voltage when the output voltage level calibration circuit is electrically connected to the memory controller.

14. A memory system comprising:

a memory controller configured to produce a reference voltage; and a semiconductor memory device, the semiconductor memory device including,
an output circuit configured to output a variable voltage to the memory controller via output pads;
a calibration circuit configured to calibrate termination resistances connected to the output pads; and
an output voltage level calibration circuit configured to calibrate a level of the variable voltage based on the reference voltage.

15. The memory system of claim 14, wherein the reference voltage is calculated based on an effective termination resistance of the semiconductor memory device.

16. The memory system of claim 14, wherein the semiconductor memory device further comprises:

a first output pad configured to provide the variable voltage to the memory controller through a first channel; and a second output pad configured to receive the reference voltage from the memory controller through a second channel.

17. The memory system of claim 16, wherein the output voltage level calibration circuit comprises:

a first pull-up circuit and a first pull-down circuit both electrically connected to the first output pad, the first pull-up circuit configured to increase the variable voltage and the first pull-down circuit configured to decrease the variable voltage;

a second pull-up circuit and a second pull-down circuit both electrically connected to the second output pad, the second pull-up circuit configured to increase the reference voltage and the second pull-down circuit configured to decrease the reference voltage.

* * * * *